United States Patent [19]

Roznieckl et al.

[11] 4,451,785

[45] May 29, 1984

[54] TESTING SYSTEM FOR ELECTRO-OPTICAL RADIATION DETECTORS

[75] Inventors: Edward J. Roznieckl; Donald R. Wittbrodt, both of Macomb, Mich.

[73] Assignee: The United States of America as represented by the Secretary of the Army, Washington, D.C.

[21] Appl. No.: 325,471

[22] Filed: Nov. 27, 1981

[51] Int. Cl.³ .............................................. G01R 31/00

[52] U.S. Cl. ................................ 324/158 R; 136/290; 368/115; 368/118

[58] Field of Search ........................ 324/158 R, 158 D; 368/115, 118; 136/290

[56] References Cited

U.S. PATENT DOCUMENTS

| | | | |
|---|---|---|---|
| 2,477,770 | 8/1949 | Richter | 368/115 |
| 2,517,987 | 8/1950 | Dickinson et al. | 368/115 |
| 3,896,378 | 7/1975 | Bedford | 368/120 |
| 4,051,437 | 9/1977 | Lile et al. | 324/158 D |

FOREIGN PATENT DOCUMENTS

| | | | |
|---|---|---|---|
| 865271 | 3/1971 | Canada | 324/158 D |

*Primary Examiner*—Stewart J. Levy

*Attorney, Agent, or Firm*—Peter A. Taucher; John E. McRae; Robert P. Gibson

[57] ABSTRACT

A laboratory testing mechanism for determining conformance of an optical radiation detector to prespecified time response requirements, comprising an electrically-operated shutter and a fast-moving rotary disc located between a radiation source and the detector under testing. Proximity switch associated with the disc provide electrical signals representing the time at which the window of the detector is initially exposed to the radiation source and selected elapsed time intervals thereafter.

8 Claims, 5 Drawing Figures

OSCILLOSCOPE
TRIG IN
CH 1
CH 2
CH 3
CH 4
OSCILLOGRAPH
CH5
CH6
TIME BASE OSCILLATOR
90° F.O.V.
STARTING CIRCUIT
STANDARD CONTROL ELECTRONIC AMPLIFIER
VALVES (LOAD)
COUPLING
BEARING HOUSING
TACHOMETER GENERATOR
SPEED INDICATOR
SPEED CONTROL

TESTING SYSTEM FOR ELECTRO-OPTICAL RADIATION DETECTORS

GOVERNMENT INTEREST

The invention described herein may be manufactured, used, and licensed by or for the Government for governmental purposes without payment to us of any royalty thereon.

BACKGROUND AND SUMMARY

Some military vehicles are equipped with combination automatic-manual systems for extinguishing fires within the personnel space and/or engine compartment. Fires can be generated by such circumstances as the passage of enemy projectiles through the vehicle fuel tank, hydraulic reservoirs and/or electric spark generation in the vicinity of fuel or oil deposits.

Fire suppression systems commonly include individual fire-suppressant bottles triggered by means of optical radiation detectors trained on interior vehicle spaces where explosive or slow-growth fires are most likely to occur; U.S. Pat. No. 3,825,754 to R. Cinzori et al shows one form that the detectors can take.

One or more of these optical radiation detectors are located in a vehicle in electrical connection with a power supply and amplifier system, which provides electrical power for operating valve actuators on the fire suppressant bottles. The bottles are strategically located to discharge Halon 1301 or similar fire-suppressing agent onto an emergent fireball, either in the engine compartment, fuel tank or personnel space. U.S. Pat. No. 3,915,237 to E. J. Rozniecki and U.S. patent application, Ser. No. 101,327, filed on Dec. 6, 1979 by K. Brobeil illustrate bottle-valve devices that can be used. Systems incorporating these radiation detectors and fire-suppressant bottles are usually able to extinguish or suppress explosive type fires within about 100 milliseconds after the instant of fire ignition.

The radiation detectors must respond within two to six milliseconds in the case of explosive fires resulting, for example, from the rupture of a fuel tank. In the case of slow-growth fires the detectors are required to trigger audible and/or visual alarms without triggering the aforementioned automatic valves associated with fire suppressant bottles. The aim is to provide a flexible system that automatically suppresses explosion-type fires while permitting manual response to slow growth fires through the judicious use of portable extinguishers. The detectors must usually be designed to avoid false alarm response to radiation from sources other than a specified threshold fire; e.g., flashlights, electric radiation heaters, rifle flash, cigarette or match flare-up and flicker, sunlight through an open hatch, or ramp under steady state or chopped-light conditions (viewed through a fan).

The present invention is directed to a laboratory testing mechanism for determining conformance of an optical radiation detector to prespecified time response requirements. The testing mechanism preferably comprises an electrically-operated shutter and a fast-moving rotary disc located between a radiation source and the detector being tested. The disc has a notched or cut-out area in its peripheral edge for traversing the shutter and the optical window in the radiation detector under test; the shutter opens at a comparatively slow rate while the disc is shielding the shutter from the radiation source. At the instant when the notch is the disc comes into registry with the shutter and radiation detector window the detector undergoes an abrupt exposure to the radiation source. The disc thus acts as a fast-acting light valve to compensate for the slow-opening nature of the shutter. Proximity switches associated with the disc provide electrical signals representing the time at which the window of the detector initially registers with the radiation source, and selected elapsed time intervals thereafter. The electrical signals may be applied to an oscillograph arranged in record detector response to the radiation source. Oscillograph readings may be taken using different types of radiation sources, different detector-radiation source spacings, different angulations of the source relative to the axis of the detector window, and different disc speeds.

One object of the invention is to provide a testing mechanism having a light valve or radiation interrupter system that opens substantially instantaneously, thus simulating an explosive-type radiation condition. Another object is to provide a light valve and shutter system that provides a step-type opening action and a wide field-of-view for the detector window, e.g., a ninety degree solid cone angle (minimum) even though the shutter per se has a slow-opening characteristic.

THE DRAWINGS

FIG. 1 schematically illustrates one form of the invention.

Figures 1, 5:
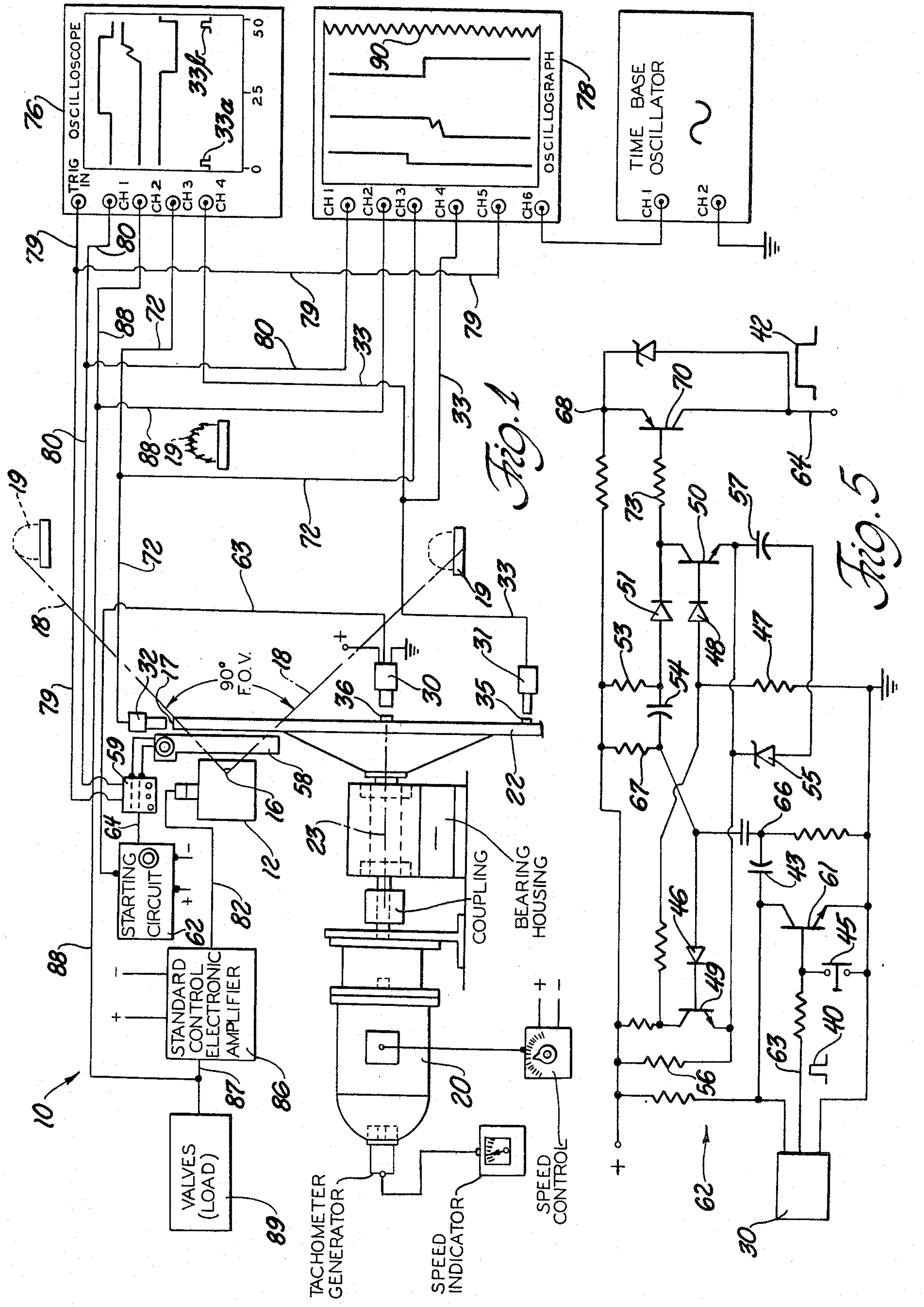
FIG. 5 illustrates a starting circuit used in the FIG. 1 system.
Figure 2:
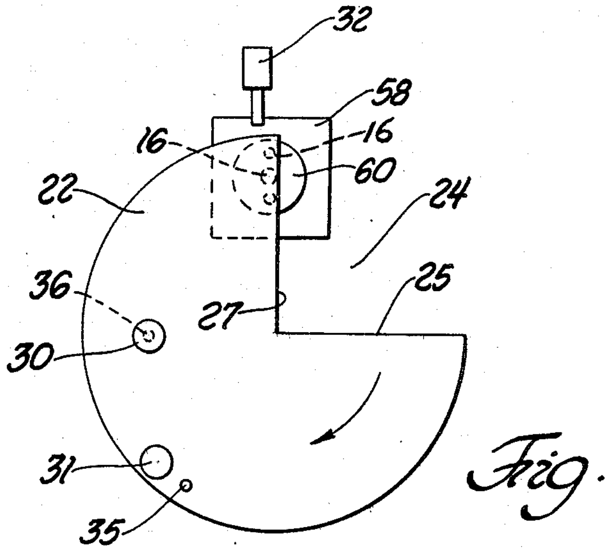
FIGS. 2, 3 and 4 are diagrammatic views showing different positions of a radiation control disc used in the FIG. 1 system.

Referring in greater detail to FIGS. 1 and 2, there is schematically shown a laboratory testing system 10 for an optical radiation detector 12 positionable on a stationary mount surface, not shown. The radiation detector is provided with three relatively small circular windows 16, each about one quarter inch or larger in diameter, capable of observing individual infrared radiation sources 19, each independently within a cone angle field-of-view 18 of approximately ninety degrees or greater. In an actual detector the separate closely-spaced windows or filters 16 are arranged in front of separate detector elements responsive to different radiation wavelengths, as more particularly described in aforementioned U.S. Pat. No. 3,825,754.

Testing system 10 comprises an electric motor 20 arranged to drive a rotary disc 22 around an axis 23 offset from the sight axis of window 16 in detector 12. In FIG. 1 the sight axis or line of sight is a horizontal line going rightwardly from window 16 to bisect the ninety degree field-of-view F.O.V. designated by numeral 18. Disc 22 speed is preferably controlled at various specific known values, e.g., twelve hundred r.p.m. The disc has a notch or cut-out 24 (FIG. 2) therein for enabling the fast-moving disc to function as a light of radiation control device. Disc 22 is preferably formed of magnetically permeable material to enable a stationary proximity switch or transducer 32 to generate signals in accordance with different positions of notch 24. The disc 22 diameter in related to the disc rotational speed and response times for detector 12 and shutter 58. In one case disc 22 had a diameter of about two feet. At a disc speed of 1200 revolutions per minute the disc required 50 milliseconds to complete one revolution. The fifty millisecond time period is sufficient to accommodate the time period to open shutter 58 (about 17 milliseconds) plus the permissible response time for detector 12 (about 6 milliseconds).

Figure 3:
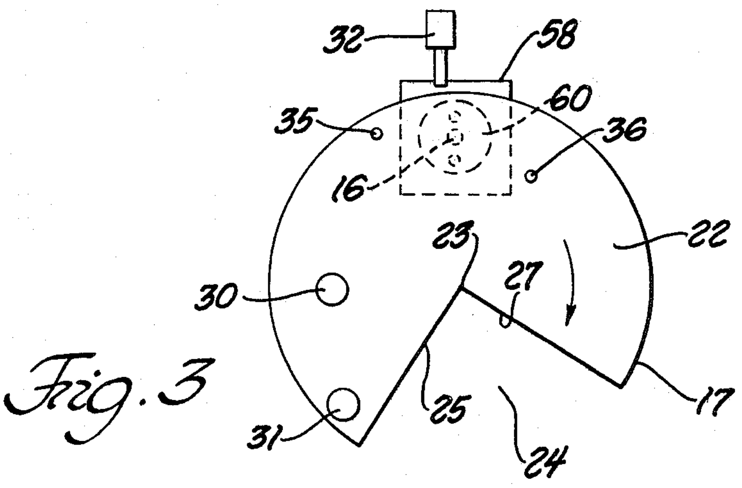
Figure 4:
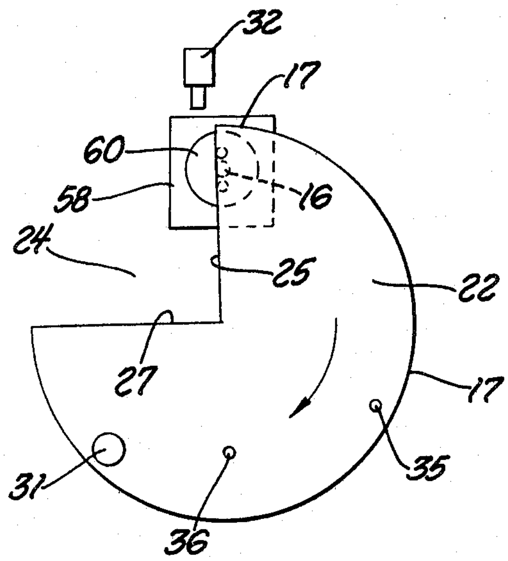

Arranged between detector 12 and disc 22 is an electrically-operated shutter 58, which may be a commercial unit available from Vincent Associates of Rochester, New York, under its model designation 262 Uniblitz; the shutter has a two and one-half inch diameter opening designated by numeral 60 (FIGS. 2, 3 and 4). The shutter is operated by a switch unit 59 that may be supplied by Vincent Associates under its designation SD-1000; time to fully open the shutter is approximately seventeen milliseconds.

The contemplated electrical control system includes a magnetic pick-up transducer 30 connected to a starting circuit 62 via circuit line 63. A second magnetic transducer 31 is arranged to generate a signal in line 33 that leads to an oscilloscope 76 and oscillograph 78. Transducer 30 is energized when soft iron button or pin 36 on disc 22 registers with the transducer. Transducer 31 is energized when soft iron button or pin 35 on disc 22 registers with the transducer. The transducers are arranged at different distances from the disc 22 rotational axis so that one pin does not inadvertently energize the inappropriate transducer. A third transducer 32 is arranged at the periphery of disc 22 to generate an electric signal when the disc edge surface 17 is in close proximity to the transducer. The disc is provided with a notch or cut-out 24; when the cut-out registers with transducer 32, as shown in FIG. 4, the transducer 32 signal is reduced or changed. Transducers 30, 31 and 32 can be proximity switches available from Electro Corp. under its designation Model 55525. Transducers 30 and 31 have pulse-type outputs that exist only as long as the associated soft iron pin 36 or 35 is in close proximity to the respective transducer. Transducer 32 has one output in the presence of edge 17 (FIG. 3) and a second output in the presence of notch 24 (FIG. 4).

The function of transducer 31 is to provide timing marks on an oscilloscope 76 and oscillograph 78 representing each complete revolution of disc 22. Each time iron button 35 passes across transducer 31 a pulse is delivered through lines 33 to provide a visible indication in channels 4, 4 of the oscillograph and oscilloscope. In an illustrative situation each revolution of disc 22 would require about fifty milliseconds, which would represent the spacing between the pulse markings 33*a* and 33*b* on channel 4 of the oscilloscope.

The function of transducer 32 is to generate a signal change when the leading edge 25 of the disc 22 cut-out passes across the sight line of detector window 16, as shown in FIG. 4; transducer 32 also measures the time that window 16 is exposed to radiation source 19.

The function of transducer 30 is to generate a signal in line 63 to energize starting circuit 62. Referring more particularly to FIG. 5, tranducer 30 delivers a short duration positive-going pulse 40 into line 63. The FIG. 5 circuitry translates that pulse into an output pulse 42 having a known duration time sufficient to energize shutter control switch unit 59 (FIG. 1). The FIG. 5 starting circuit includes a monostable multivibrator generally similar to that described in "Transistor Circuit Analysis and Design" by Fitcher, Van Nostrand, Series, copyright 1960. The circuit additionally comprises diodes 46 and 48, which serve as blocking diodes to protect the base-emitter junctions of transistors 49 and 50. A third diode 51 serves as a D.C. blocking diode to obtain a sharp rise time at the collector of transistor 50. Resistor 53 acts to charge capacitor 54.

In the base circuit of transistors 49 and 50 zener diode 55 serves as an emitter bias, with resistor 56 and capacitor 57 serving as a bias stabilizer and filter. Resistor 47 is a coupling resistor to hold the base of transistor 50 below cutoff level during quiescent operation. During quiescent operation transistor 49 is on and transistor 50 is off.

When monetary push-button switch 45, which is normally closed, is manually held open the pulse 40 turns on transistor 61. Capacitor 43 discharges through the collector-emitter junction of transistor 61, causing a negative pulse to be developed at junction 66. The negative pulse causes transistor 49 to turn off and transistor 50 to turn on. Transistor 50 remains saturated on for a period of time determined by resistor 67 and capacitor 54, i.e., the R-C time constant.

As transistor 50 turns on, a current flows from junction 68 through the emitter-base circuit of transistor 70, resistor 73, the collector-emitter circuit of transmitter 50 and zener diode 55. Transistor 70 sharply goes into saturation, causing current to flow through output line 64 to the aforementioned shutter operator 59. The general purpose of the FIG. 5 circuitry is to amplify and lengthen pulse 40 generated by proximity switch 30, to accord with operating requirements of operator 59.

Commercial shutter operator 59 initiates a shutter-opening action when push-button switch 45 is held open and transducer 30 is delivering a trigger pulse through line 63 to the FIG. 5 circuit. Since disc 22 is rotating at a comparatively high rotational speed, e.g. 1200 revolutions per minute, switch 45 needs to be held open only momentarily. FIG. 2 illustrates the position of disc 22 when unit 59 signals shutter 58 to begin opening. At that same instant shutter operator 59 generates a signal in line 79 (FIG. 1) that triggers an oscilloscope 76 and oscillograph 78 into operation. Shutter 58 translates to a fully open condition while disc 22 is still shielding the shutter opening from radiation source 19, as depicted in FIG. 3 FIG. 3 is taken about seventeen milliseconds after FIG. 2, i.e., the time required to fully open the shutter opening 60. At the instant when shutter 58 is fully open (FIG. 3) a light-sensitive diode in commercial control unit 59 generates a signal in line 80 (FGI. 1) that is applied to channels 1, 1 in the oscilloscope 76 and oscillograph 78.

As shown in FIG. 4, when the leading edge 25 of the disc 22 notch starts to uncover the now-opened shutter opening 60 and detector windows 16, the peripheral edge 17 of disc 22 moves beyond or away from the third magnetic transducer 32. Transducer 32 output line 72 (FIG. 1) experiences a sharp change in signal strength, as reflected on channel 3 of oscilloscope 76. A major aim of the testing system is to determine the response time of detector 12 to the onset of one flame in the detector field-of-view 18. FIG. 4 shows the disc 22 position as detector windows 16 are just starting to be exposed to the radiation. Response of detector 12 to the infrared radiation produces a trigger signal in detector output line 82 (FIG. 1) that causes conventional amplifier driver 86 to provide an amplified current in line 87, sufficient to operate fire-suppressant valve, or valves, 89. Line 87 current also is directed through branch signal lines 88 for energizing channels 2, 2 in the oscilloscope and oscillograph. A comparison of channels 2 and 3 indicates the elapsed time interval between the instant when detector 12 is initially exposed to the radiation source and the instant when the load, i.e., valve 89 is energized. Channel 3 records the exposure time of window 16 to the radiation, i.e., the length of cut-out 24 in disc 22.

Oscillograph 78 provides a permanent record of the information generated in oscilloscope 76. As shown in FIG. 1, the paper travels upwardly to generate the visible markings shown in the drawing. The oscillograph contains an additional channel 6 that provides a sine wave signal line 90 having a wavelength related to elapsed line, e.g. a wavelength equivalent to one millisecond. The paper speed through the oscillograph should be relatively high for a useful system, i.e., in the neighborhood of one hundred feet per second.

All information is derived during one revolution of disc 22. The disc may be driven at different known rotational speeds to provide different radiation exposure times for detector window 16, i.e., the time interval during which notch 24 of the disc exposes window 16 to radiation source 19. The radiation source can be positioned at different distances from disc 22 and at different locations within the conical field-of-view 18 to measure the ability of detector 12 to respond to off-axis fire conditions. The nature of radiation source 19 may be changed to measure the discriminatory capability of detector 12 to distinguish fires from other types of optical radiations.

When the radiation source is located rightwardly of the detector system, as seen in FIG. 4, the disc 22 speed may be increased to a predetermined known value to compensate for the fact that leading edge 25 of notch 24 exposes the detector windows 16 to the rightwardly-located scene at a slightly later point in the disc travel, compared to the scene directly in front of windows 16. The short time interval between a first condition, wherein disc 22 is just overlapping windows 16 (FIG. 4), and a second condition wherein edge 25 of the notch is just to the right of windows 16, represents the real response time of the testing system. Test system response time should be at least about three times faster than the response time of the detector being tested. Test system response time can be controlled by disc 22 size (i.e. linear speed of notch edge 25 across windows 16 per unit rotational speed of the disc) and the disc absolute rotational speed.

To briefly review the testing sequence, the first operation is to start motor 20 so that disc 22 is brought up to a predetermined known rotational speed. With disc 22 rotating, manual opening of switch 45 initiates the test sequence. With switch 45 held open the passage of pin 36 across transducer 30 (FIG. 2) causes the FIG. 5 circuit to generate a long duration pulse 42 in line 64, sufficient to operate control switch unit 59. Line 79 is thus energized to start oscillograph 78 and oscilloscope 76. When disc 22 reaches the FIG. 3 position shutter opening 60 will be fully open; at that instant control unit 59 will generate a signal in line 80. As disc 22 passes the FIG. 4 position windows 16 in the detector under test will be exposed to radiation source 19; transducer 32 will record this event by generating a signal in line 72. The next event in the sequence is the generation of a detector output signal in line 82 and an amplified output in line 88. When the trailing edge 27 of disc notch 24 moves up to the twelve o'clock position (FIG. 2) switch 32 will produce a signal change in line 72. The various events will be recorded on oscillograph 78 and oscilloscope 76. The above description of events is based on starting the sequence of events when notch 24 in disc 22 is in the FIG. 2 position. This is not critical; the disc could be in various starting attitudes, the only requirement being that pin 36 is sufficiently spaced from leading edge 25 of notch 24 that window 60 is opened before detector windows 16 are exposed to the radiation source.

We wish it to be understood that we do not desire to be limited to the exact details of construction shown and described for obvious modifications will occur to a person skilled in the art.

We claim:

1. Mechanism for testing the electrical response time of an optical radiation detector (12) designed to have a sighting window (16) exposed to radiation for generating an electrical output signal after a predetermined exposure time to a given type of radiation: said testing mechanism comprising an electrically-operated shutter (58) positioned in close proximity to the sighting window of the detector for normally shielding the detector from a test radiation source (19); electric means (59) for opening the shutter; a rotary disc (22) positioned in close proximity to the shutter for interrupting the flow of radiant energy from the aforementioned test radiation source to the shutter; motor means (20) for rotating the disc around an axis spaced from a line of sight taken through the detector window and shutter; said disc having an opening (24) offset from the disc rotational axis, whereby said opening passes across the shutter once during each revolution of the disc; the disc opening having a leading edge (25) and a trailing edge (27); electric means (30,36) for generating a first start signal when the disc is in a known position shielding the shutter from the radiation source; a manually-controlled circuit (62) interconnecting the start signal means and shutter opening means (59), whereby the shutter undergoes an opening action while the disc is shielding the shutter from the test radiation source; means (32) for generating a second electric signal when the leading edge of the disc opening (24) is passing across the shutter line of sight, thereby signalling the precise moment when the detector under test begins to be exposed to the test radiation source; and third electric signal means (88) connected with the electrical output of the detector under test, said last mentioned electric signal means providing a third signal representing the moment when the detector has generated a useful output signal resulting from exposure to the test radiation source; the elapsed time between the second and third signals constituting the response time of the detector under test; the aforementioned disc opening (24) having a sufficient circumferential length, measured from its leading edge to its trailing edge, that satisfactory detector response times are achieved while the disc opening is in optical communication with the shutter line of sight.

2. The mechanism of claim 1 wherein said means for generating a first start signal comprises a first magnetically-operated proximity switch (30) located at a stationary point near the disc, and a magnetically permeable projection (36) carried at a specific location on the disc to operate said first switch when the disc is in a known position.

3. The mechanism of claim 1 wherein said manually-controlled circuit (62) comprises a monostable multivibrator.

4. The mechanism of claim 3 wherein said manually-controlled circuit (62) includes a momentary push button switch (45) and transistor (61) arranged to cooperatively switch the multivibrator when an electrical pulse is received from the aforementioned first start signal means.

5. The mechanism of claim 4 wherein said manually-controlled circuit (62) includes an output power transistor (70) controlled by the multivibrator.

6. The mechanism of claim 1: said means for generating the second electric signal comprising a second proximity switch (32) located at a stationary point near the peripheral edge of the aforementioned disc to sense the positions of the leading end trailing edges of the disc opening.

7. The mechanism of claim 1 and further comprising an oscilloscope having a first channel electrically connected to said second electric signal means, and a second channel electrically connected with said third electric signal means.

8. The mechanism of claim 1 wherein the shutter has a relatively large diameter shutter opening, sufficient to give the detector window an approximately ninety degree conical field-of-view.

* * * * *